United States Patent Office 3,748,133

Patented July 24, 1973

3,748,133

PHOTOPOLYMERIZABLE COMPOSITIONS AND ELEMENTS AND USES THEREOF

John M. Noonan, Robert C. McConkey, Joseph A. Arcesi, and Frederick J. Rauner, Rochester, N.Y., assignors to Eastman Kodak Company, Rochester, N.Y.

No Drawing. Filed Mar. 24, 1972, Ser. No. 237,929
Int. Cl. G03c 5/00
U.S. Cl. 96—35.1 21 Claims

ABSTRACT OF THE DISCLOSURE

Novel photopolymerizable compositions comprise an ethylenically unsaturated monomer which is a bisacrylate or bismethacrylate of a bisphenol wherein the phenol groups are joined by an aliphatic ketone group, a film-forming aromatic polysulfonate or polysulfonate-carboxylate binder and a photo-activatable polymerization initiator. These compositions, and elements containing them, can be used to prepare resists, printing plates, and other photomechanical images.

This application relates to photosensitive compositions and elements and to methods and to methods of using such materials to prepare photomechanical images. In a particular aspect it relates to a photopolymerizable compositions and elements and to their use in the preparation of photoresist images and printing plates.

Photopolymerizable compositions have been the subject of increasing interest in recent years. Such compounds typically comprise a monomer, containing unsaturated sites which are capable of undergoing addition polymerization, and a photoactivatable polymerization initiator. Preferably, these monomers have one or more terminal carbon to carbon double bonds, and have been referred to in the art as ethylenically unsaturated monomers. The photopolymerization initiator is a compound which produces free radicals on exposure to actinic radiation and which in its excited state will react with the double bond on the monomer to initiate polymerization. Optionally, these compositions also contain a binder to provide a solid layer when the composition is coated, a sensitizer which increases the photographic speed of the composition or extends its range of spectral response, or both, and a thermal polymerization inhibitor which prolongs the shelf life of the composition, as well as other addenda such as dyes, pigments and the like.

Such compositions have generally been employed in the photographic arts to prepare photomechanical images for use as etching or plating resists, relief and planographic printing plates, and the like. These reproduction processes make use of the difference in solubility and softening point which occurs upon exposure of the composition to actinic radiation and resultant polymerization of the monomer. Thus, in a typical process a layer of the photopolymerizable composition is exposed to actinic radiation to effect polymerization of the monomer in exposed areas and an image is developed by solvent washout of unexposed areas, thermal transfer of unexposed areas, or similar procedures. Representative photopolymerizable compositions and processes for employing them to prepare photomechanical images are described in such patents as U.S. Pats. 2,760,863, 3,060,023, 3,346,383, 3,353,955, 3,458,311, 3,469,982.

We have found novel photopolymerizable compositions containing novel photopolymerizable monomers and binders which give hard, non-brittle, photomechanical images. These compositions can be used to prepare photoresists and printing plates by solvent development or thermal transfer processes, as well as to prepare other types of photographic images for which photopolymerizable compositions have typically been used.

It is an object of this invention to provide novel photopolymerizable monomers.

It is a further object to provide novel photopolymerizable compositions comprising a photopolymerizable monomer and a polymeric binder.

It is still another object of this invention to provide novel photosensitive elements employing the photopolymerizable monomers and compositions of the present invention.

It is yet a further object of this invention to provide novel photoresist compositions and lithographic printing plates employing the photopolymerizable monomers and compositions of this invention.

It is another object of this invention to provide processes for preparing photomechanical images employing the photopolymerizable monomers and compositions of the present invention.

The above and other objects of this invention will become apparent to those skilled in the art from the further description of the invention which follows.

In accordance with the present invention there is provided a photopolymerizable composition comprising an ethylenically unsaturated monomer which is a bisacrylate or bismethacrylate of a bisphenol wherein the phenol groups are joined by an aliphatic ketone group (including cycloaliphatic ketone groups), a film-forming aromatic polysulfonate or polysulfonate-carboxylate binder, a photoactivatable polymerization initiator, and optionally, such components as thermal polymerization inhibitors, sensitizers and the like.

Typical of the photopolymerizable bisacrylates and bismethacrylates of bisphenols which are suitable for use in the present invention are those which can be represented by the structural formula (I)

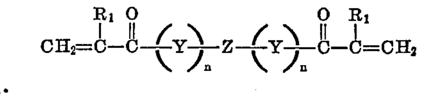

where:

$R_1$ is hydrogen or methyl;

Z is

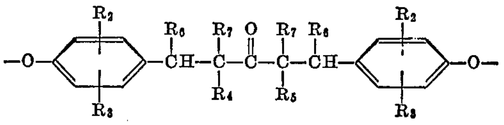

where:

$R_2$ and $R_3$ are independently hydrogen or methoxy,
$R_4$ and $R_5$ are hydrogen or together represent the hydrocarbon group necessary to complete a ring of 5 to 6 carbon atoms, e.g. cyclopentylene or cyclohexylene,
$R_6$ and $R_7$ are hydrogen or together represent a covalent bond,
$n$ is 0 or 1;

Y is a linking group which can be represented by one of the following structural formulae:

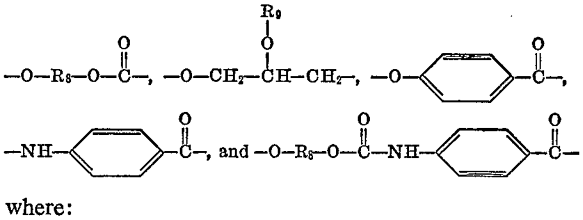

where:

$R_8$ is alkylene of 1 to 4 carbon atoms, e.g. methylene, ethylene, propylene, butylene, etc. and
$R_9$ is hydrogen, alkanoyl of 1 to 4 carbon atoms, or acryloyl or methacryloyl.

Particularly preferred monomers of this invention have the structure I, above, where $R_2$ is methoxy,
$R_3$ is hydrogen,
$R_4$, $R_5$, $R_6$ and $R_7$ are as defined above,
$n$ is 1, Y is $$-O-R_8-O-\overset{O}{\overset{\|}{C}}- \text{ or } -O-CH_2-\underset{}{\overset{\overset{R_9}{|}\atop O}{\overset{|}{C}H}}-CH_2-$$

and
$R_8$ and $R_9$ are as defined above.

Representative monomers of the above formulae include:

1,3-bis[4-(3-acryloyloxypropoxycarbonyloxy) vanillyl]acetone,
1,3-bis[4-(2-methacryloyloxyethoxycarbonyloxy)-vanillylidene]acetone,
2,5-bis{4-[4-(4-acryloyloxybutoxyformamido)benzoyloxy]vanillyl}cyclopentanone,
2,5-bis{4-[4-(2-acryloyloxyethoxyformamido)benzoyloxy]vanillylidene}cyclopentanone,
1,3-bis{4-[4-(2-methacryloyloxyethoxyformamido)benzoyloxy]-3-vanillylidene}acetone,
2,6-bis[4-(4-acrylamidobenzoyloxy)vanillyl]cyclohexanone,
2,6-bis[4-(4-methacrylamidobenzoyloxy)vanillylidene] cyclohexanone,
1,3-bis[4-(4-methacrylamidobenzoyloxy)-3-vanillylidene] acetone,
1,3-bis[4-(4-acryloyloxybenzoyloxy)vanillyl]acetone,
1,3-bis[4-(4-methacryloyloxybenzoyloxy)vanillylidene] acetone,
2,5-bis[4-(4-acryloyloxybenzoyloxy)vanillyl]cyclopentanone,
2,5-bis[4-(4-methacryloyloxybenzoyloxy)vanillylidene] cyclopentanone,
2,6-bis[-(4-acryloyloxybenzoyloxy)vanillyl]cyclohexanone,
2,6-bis[4-(4-methacryloyloxybenzoyloxy)vanillylidene] cyclohexanone,
1,3-bis[4-(3-acryloyloxy-2-hydroxypropyl)vanillyl] acetone,
1,3-bis[4-(2-hydroxy-3-methacryloyloxypropyl) vanillylidene]acetone,
2,5-bis[4-(3-acryloyloxy-2-hydroxypropyl)vanillyl] cyclopentanone,
2,5-bis[4-(2-hydroxy-3-methacryloyloxypropyl) vanillylidene]cyclopentanone,
2,6-bis[4-(3-acryloyloxy-2-hydroxypropyl)vanillyl] cyclohexanone,
2,6-bis[4-(2-hydroxy-3-methacryloyloxypropyl) vanillylidene]cyclohexanone,
1,3-bis[4-(3-acryloyloxy-2-propionyloxypropyl) vanillylidene]acetone,
1,3-bis[4-(3-acryloyloxy-2-acetoxypropyl)vanillyl] acetone,
1,3-bis[4-(3-methacryloyloxy-2-butyryloxypropyl) vanillylidene]acetone,
1,3-bis[4-(2,3-diacryloyloxypropyl)vanillylidene] acetone,
1,3-bis[4-(2,3-dimethacryloyloxypropyl)vanillylidene] acetone,
2,5-bis[4-(2,3-diacryloyloxypropyl)vanillyl]cyclopentanone,
2,5-bis[4-(2,3-dimethacryloyloxypropyl)vanillylidene] cyclopentanone,
2,5-bis[4-(2-acryloyloxy-3-methacryloyloxypropyl) vanillylidene]cyclopentanone,
2,6-bis[4-(2,3-diacryloyloxypropyl)vanillylidene] cyclohexanone,
2,6-bis[4-(2,3-dimethacryloyloxypropyl)vanillyl] cyclohexanone,
2,6-bis[4-(3-acryloyloxy-2-methacryloyloxypropyl) vanillyl]cyclohexanone,
1,3-bis[4-(3-acryloyloxpyropoxycarbonyloxy) benzylidene]acetone,
1,3-bis[4-(2-methacryloyloxyethoxycarbonyloxy) benzyl]acetone,
2,5-bis{4-(4-acryloyloxybutoxyformamido)benzoyloxy] benzyl}cyclopentanone,
2,5-bis{4-[4-(2-acryloxyloxyethoxyformamido) benzoyloxy]benzylidene}cyclopentanone,
2,6-bis[4-(4-acrylamidobenzoyloxy)benzylidene] cyclohexanone,
2,6-bis[4-(4-methacrylamidobenzoyloxy)benzyl] cyclohexanone,
1,3-bis[4-(4-acryloyloxybenzoyloxy)benzyl]acetone,
1,3-bis[4-(4-methacryloyloxybenzoyloxy)benzylidene] acetone,
2,5-bis[4-(4-acryloyloxybenzoyloxy)benzyl]cyclopentanone,
2,5-bis[4-(4-methacryloyloxybenzoyloxy)benzylidene] cyclopentanone,
2,6-bis[4-(4-acryloyloxybenzoyloxy)benzylidene] cyclohexanone,
2,6-bis[4-(4-methacryloyloxybenzoyloxy)benzyl] cyclohexanone,
1,3-bis[4-(3-acryloyloxy-2-hydroxypropyl)benzylidene] acetone,
1,3-bis[4-(2-hydroxy-3-methacryloyloxypropyl) benzyl]acetone,
2,5-bis[4-(3-acryloyloxy-2-hydroxypropyl)benzylidene]cyclopentanone,
2,5-bis[4-(2-hydroxy-3-methacryloyloxypropyl) benzyl]cyclopentanone,
2,6-bis[4-(3-acryloyloxy-2-hydroxypropyl)benzylidene] cyclohexanone,
2,6-bis[4-(2-hydroxy-3-methacryloyloxypropyl) benzyl]cyclohexanone,
1,3-bis[4-(3-acryloyloxy-2-propionyloxypropyl) benzylidene]acetone,
1,3-bis[4-(3-acryloyloxy-2-acetoxypropyl)benzyl] acetone,
1,3-bis[4-(3-methacryloyloxy-2-butyryloxypropyl) benzylidene]acetone,
1,3-bis[4-(2,3-diacryloyloxypropyl)benzyl]acetone,
1,3-bis[4-(2,3-dimethacryloyloxypropyl)benzyl]acetone,
2,5-bis[4-(2,3-diacryloyloxypropyl)benzyl] cyclopentanone,
2,5-bis[4-(2,3-dimethacryloyloxypropyl)benzylidene] cyclopentanone,
2,5-bis[4-(2-acryloyloxy-3-methacryloyloxypropyl) benzylidene]cyclopentanone,
2,6-bis[4-(2,3-diacryloyloxypropyl)benzylidene] cyclohexanone,
2,6-bis[4-(2,3-dimethacryloyloxypropyl)benzyl] cyclohexanone,
2,6-bis[4-(3-acryloyloxy-2-methacryloyloxypropyl) benzyl]cyclohexanone,
1,3-bis[4-(3-methacryloyloxypropoxycarbonyloxy) benzylidene]acetone,
1,3-bis[4-(2-acryloyloxyethoxycarbonyloxy)benzyl] acetone,
2,5-bis{4-(4-methacryloyloxybutoxyformamido) benzoyloxy]benzyl}cyclopentanone.

The monomers of the invention where $n$ in structure I, above, is 0 can be prepared by condensing an acryloyl chloride or methacryloyl chloride with a bisphenol such as 1,3-divanillylideneacetone, 2,5-divanillylidenecyclopentanone, 2,6-divanillylidenecyclohexanone, 1,3-bis(4-hydroxybenzylidene)acetone, 2,5-bis(4-hydroxybenzylidene) cyclopentanone, 2,6-bis(4-hydroxybenzylidene)cyclohexanone and their corresponding hydrogenated ketones and secondary alcohols. The monomers of the invention containing an intermediate linking group, Y in structure I, above, can be prepared by performing a condensation reaction first between one of the above condensation reactants (i.e. the acryloyl or methacryloyl chloride or the bisphenol) and a compound which will provide the appropriate linking group (Y) and then condensing this product with the other condensation reactant (i.e. the bisphenol or the acryoyl or methacryloyl chloride). For example, a chloroformyloxyalkyl acrylate or methacrylate, which is prepared by condensation of a glycol with an acrylic or methacrylic acid chloride followed by treatment with phosgene, can be condensed with a bisphenol to provide monomers of the invention having $$-O-R_8-O-\overset{\overset{O}{\|}}{C}-$$

linking groups. Similarly, a chloroformyloxyalkyl acrylate or methacrylate can be first condensed with a carboxyaniline or a carboxyphenol such as p-aminobenzoic acid or p-hydroxybenzoic, the acid converted to the acid chloride, and the acid chloride reacted with a bisphenol to provide compounds having urethan or carbonate linkages, respectively, as represented by

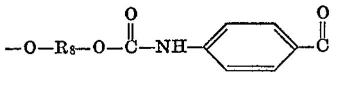

and

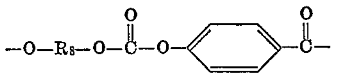

Further, acryloyl or methacryloyl chloride can be reacted with a carboxy aniline or carboxy phenol, converted to the acid chloride, and reacted with a bisphenol, as above, to provide monomers wherein the linking groups (Y) are

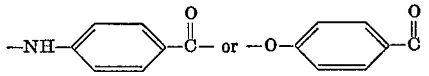

respectively. In another variation, acryloyl chloride or methacryloyl chloride can be condensed with glycidol to form the glycidyl acrylate or glycidyl methacrylate and these esters reacted with bisphenols by addition to provide monomers having the $$-O-CH_2-\underset{\underset{OH}{|}}{C}H-CH_2-$$

linking group. The —OH group can then be esterified with an aliphatic acid chloride to provide monomers having the $$-O-CH_2-\underset{\underset{OR_9}{|}}{C}H-CH_2-$$

linking group.

While these monomers give useful results in photopolymerizable compositions which do not contain a binder, or in compositions which contain one or more of a variety of film-forming polymeric binders, such as those known in the art for use in photopolymerizable compositions, as well as others, they give particularly useful results in compositions containing the aromatic polysulfonate or polysulfonate-carboxylate binders described below.

The film-forming binders which are particularly useful in the compositions of the present invention are nonlight-sensitive aromatic polysulfonates or polysulfonate-carboxylates, prepared by condensing at least one bisphenol, in at least one of which the phenol groups are joined to each other by an aliphatic ketone group or an aliphatic secondary alcohol group (including cycloaliphatic ketone and secondary alcohol groups), with at least one aromatic disulfonic acid chloride (in the case of polysulfonates) or with a mixture of at least one aromatic disulfonic acid chloride and at least one aromatic dicarboxylic acid chloride or aromatic bischloroformate (in the case of polysulfonate-carboxylates). After preparation, the polymers from a bisphenol containing an aliphatic secondary alcohol group can be modified by reaction with an alkyl acid halide to convert at least some of the secondary alcohol groups to alkyl ester groups.

Thus, these polymers contain units derived from at least one bisphenol, in at least one of which the phenol groups are joined by an aliphatic ketone group or an aliphatic secondary alcohol group alternating with units derived from an aromatic diacid chloride. In the case of polysulfonate binders the alternating units are derived solely from aromatic disulfonic acid chlorides. In the case of polysulfonate-carboxylate binders, the alternating units are derived from aromatic disulfonic acid chlorides and aromatic dicarboxylic acid chlorides or aromatic bischloroformates.

Units derived from a bisphenol containing an aliphatic ketone group or an aliphatic secondary alcohol group joining the phenol groups can be represented by the structure II) 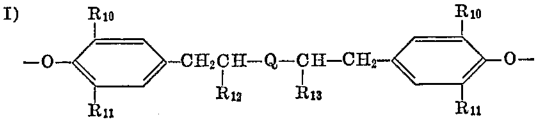

where $R_{10}$ and $R_{11}$ are each hydrogen, lower alkyl of 1 to 4 carbon atoms, e.g. methyl, ethyl, propyl, butyl etc. or lower alkoxy of 1 to 4 carbon atoms e.g. methoxy, ethoxy, propoxy, butoxy, etc.; $R_{12}$ and $R_{13}$ are each hydrogen or together represent the hydrocarbon group necessary to complete a saturated ring of 5 to 6 carbon atoms e.g. cyclopentylene and cyclohexylene; Q is $$-\overset{\overset{O}{\|}}{C}-$$

group or a $$-\overset{\overset{OR_{14}}{|}}{C}H-$$

group; and $R_{14}$ is hydrogen or an alkanoyl group of 2 to 20 carbon atoms e.g. ethanoyl, butanoyl, pentanoyl, hexanoyl, decanoyl, dodecanoyl, hexadecanoyl, eicosanoyl, etc.

Representative bisphenols from which this structure can be derived include:

1,5-bis(4-hydroxyphenyl)pentan-3-one,
1,5-bis(4-hydroxyphenyl)pentan-3-ol,
2,5-bis(4-hydroxybenzyl)cyclopentanone,
2,5-bis(4-hydroxybenzyl)cyclopentanol,
2,6-bis(4-hydroxybenzyl)cyclohexanone,
2,6-bis(4-hydroxybenzyl)cyclohexanol,
1,5-bis(4-hydroxy-3-methoxyphenyl)pentan-3-one,
1,5-bis(4-hydroxy-3-methoxyphenyl)pentan-3-ol,
2,5-bis(4-hydroxy-3-methoxybenzyl)cyclopentanone,
2,5-bis(4-hydroxy-3-methoxybenzyl)cyclopentanol,
2,6-bis(4-hydroxy-3-methoxybenzyl)cyclohexanone,
2,6-bis(4-hydroxy-3-methoxybenzyl)cyclohexanol,
1,5-bis(4-hydroxy-3-ethoxyphenyl)pentan-3-one,
1,5-bis(4-hydroxy-3-butoxyphenyl)pentan-3-ol,
2,5-bis(4-hydroxy-3-methylbenzyl)cyclopentanone,
2,5-bis(4-hydroxy-3-ethylbenzyl)cyclopentanol,
2,6-bis(4-hydroxy-3-propylbenzyl)cyclohexanone,
2,6-bis(4-hydroxy-3-butylbenzyl)cyclohexanol,
1,5-bis(4-hydroxy-3,5-dimethoxyphenyl)pentan-3-ol,
1,5-bis(4-hydroxy-3,5-dimethylphenyl)pentan-3-one,
2,5-bis(4-hydroxy-3,5-dimethylbenzyl)cyclopentanone,
2,5-bis(4-hydroxy-3,5-dimethoxybenzyl)cyclopentanol.

Units derived from other bisphenols, which can be contained in the polymeric binder in addition to the units having the structure II, above, can be represented by the structure:

(III)

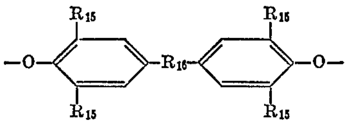

wherein $R_{15}$ is independently hydrogen, halogen or lower alkyl of 1 to 4 carbon atoms and $R_{16}$ is an alkylene group of 1 to 8 carbon atoms.

Representative bisphenols which provide units of this structure include 2,2-bis(4-hydroxyphenyl)propane [Bisphenol A],
2,2-bis(4-hydroxy - 3,5 - dichlorophenyl)propane [Tetrachloro Bisphenol A]
2,2-bis(4-hydroxy - 3,5 - dibromophenyl)propane [Tetrabromo Bisphenol A],
2,2-bis(4-hydroxy-3,5 - diiodophenyl)propane [Tetraiodo Bisphenol A],
bis(4-hydroxyphenyl)methane, and
2,2'-bis(4-hydroxyphenyl)hexane.

Suitable units derived from aromatic disulfonic acid chlorides can be represented by the structure:

(IV)

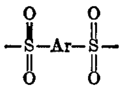

wherein Ar represents an arylene group such as a phenylene group, a biphenylylene group, a naphthylene group, an anthrylene group, etc., including arylene groups substituted with substituents which will not interfere with the polymerization reaction such as halogen, nitro, cyano, lower alkyl of 1 to 12 carbon atoms, e.g., methyl, ethyl, propyl, isopropyl, butyl, sec-butyl, t-butyl, n-amyl, isoamyl, hexyl, heptyl, octyl, nonyl, decyl, undecyl, dodecyl etc., lower alkoxy of 1 to 12 carbon atoms, e.g., methoxy, ethoxy, propoxy, butoxy, amyloxy, hexoxy, heptoxy, etc., and the like.

Preferred units derived from aromatic disulfonic acid chlorides are represented by the structure:

(V)

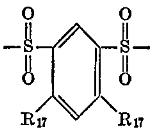

wherein $R_{17}$ is independently a hydrogen atom or a lower alkyl group of 1 to 4 carbon atoms, e.g., methyl, ethyl, propyl, butyl.

Representative aromatic disulfonic acid chlorides from which units of the above structural formulae can be derived include benzenedisulfonyl chlorides such as:

1,3-benzenedisulfonyl chloride,
1-chloro-2,4-benzenedisulfonyl chloride,
1-bromo-3,5-benzenedisulfonyl chloride,
1-nitro-3,5-benzenedisulfonyl chloride,
1-cyano-3,5-benzenedisulfonyl chloride,
1-methyl-2,4-benzenedisulfonyl chloride,
1-methyl-4-chloro-2,6-benzenedisulfonyl chloride,
1-ethyl-2,4-benzenedisulfonyl chloride,
1-butyl-2,4-benzenedisulfonyl chloride,
1,2-dimethyl-3,5-benzenedisulfonyl chloride,
1,3-dimethyl-2,4-benzenedisulfonyl chloride,
1,3-dimethyl-4,6-benzenedisulfonyl chloride,
1,4-dimethyl-2,6-benzenedisulfonyl chloride,
1-methoxy-2,4-benzenedisulfonyl chloride;

biphenyldisulfonyl chlorides such as 2,2'-biphenyldisulfonyl chloride,
3,3'-biphenyldisulfonyl chloride,
4,4'-biphenyldisulfonyl chloride,
4,4'-dibromo-3,3'-biphenyldisulfonyl chloride,
4,4'-dimethyl-3,3'-diphenyldisulfonyl chloride;

naphthalene- and anthracenedisulfonyl chlorides such as 1,3-naphthalenedisulfonyl chloride,
2,6-naphthalenedisulfonyl chloride,
1-chloro-2,7-naphthalenedisulfonyl chloride,
1-chloro-3,5-naphthalenedisulfonyl chloride,
1-nitro-3,6-naphthalenedisulfonyl chloride,
2-ethoxy-1,6-naphthalenedisulfonyl chloride,
1,5-anthracenedisfonyl chloride,
1,8-anthracenedisulfonyl chloride, etc.; and the like.

Suitable units derived from aromatic diacid chlorides can be represented by the structure:

(VI)

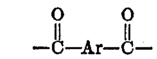

wherein Ar is as defined above in Formula IV and preferably by the structure (VII)

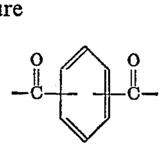

Representative aromatic diacid chlorides which can provide such units include phthaloyl chloride,
terephthaloyl chloride,
isophthaloyl chloride,
2,5-naphthalene dicarboxylic acid chloride,
4,4'-binphenyldicarboxylic acid chloride, etc.

Suitable units derived from bischloroformates can be represented by the structural formula:

(VIII)

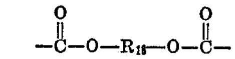

where $R_{18}$ is an alkylene group of 1 to 20 carbon atoms such as ethylene, propylene, diethylene, pentylene, neopentylene, nonylene, decylene, etc.

Bischloroformates which can provide units having this structure include ethylene bischloroformate,
diethylene bischloroformate,
triethylene bischloroformate,
1,3-propanediol bischloroformate,
2-methyl-2-nitro-1,3-propanediol bischloroformate,
2-ethyl-2-isobutyl-1,3-propanediol bischloroformate,
diisopropylene bischloroformate,
pentamethylene bischloroformate,
neopentyl bischloroformate,
nonamethylene bischloroformate,
decamethylene bischloroformate,
tetradecamethylene bischloroformate,
octadecamethylene bischloroformate,
2,2,4,4-tetramethyl-1,3-cyclobutylene bischloroformate,
2,4-dimethyl-2,4-dipropyl-1,3-cyclobutylene bischloroformate
cis-cyclododecylene-1,2-bischloroformate,
5-cis-9-transcyclododecylene-1,2-cis-bischloroformate,
dispiro[5.1.5.1]tetradecylene-7,12-bischloroformate,
1,4-cyclohexanedimethanol bischloroformate,
1,3-cyclohexanedimethanol bischloroformate,
1,4-bis($\beta$-hydroxyethoxy)cyclohexane bischloroformate,
ditetramethylsuccinate bischloroformate,
dinonamethylene azelate bischloroformate,
bis[2-(2-chloroformyloxyethylsulfonyl)ethyl]ether, and
1,2-bis[2-(chloroformyloxyethylsulfonyl)ethoxy]ethane.

These polymeric binders can be prepared by conventional polymerization techniques such as solution polymerization, interfacial polymerization, and similar techniques. Typically, the bisphenol, or its alkali metal salt, is reacted with the acid chloride in an inert organic solvent in the presence of a catalyst such as a basic organic catalyst such as quaternary ammonium salts, amines, and the like. The reaction mixture is maintained at room temperature or slightly elevated temperatures and stirred for varying periods of time. The resultant polymer can be collected by precipitation with a non-solvent therefor and then washed and dried. Suitable preparative techniques for preparing these polymeric binders are described in such patents as U.S. Pats. 3,262,914, 3,236,808, 3,236,809 and 3,401,148.

While these polymeric binders are particularly suitable for use in photopolymerizable compositions containing the monomers described above, they can be used in conjunction with other monomers.

The photoactivatable polymerization initiators useful in the compositions of the present invention can be any of the photopolymerization initiators known and employed in the art. Preferably, these compounds are thermally inactive at temperatures encountered during storage and handling of the compositions and elements prepared therewith, i.e., temperatures below about 100° C.

Suitable initiators include aryldiazo sulfones such as those described in Rauner et al. U.S. application Ser. No. 46,517, filed June 15, 1970, which also describes suitable sensitizers. Other suitable initiators include polynuclear quinones, which are compounds having two intracyclic carbonyl groups attached to intracyclic carbon atoms in a conjugated carbocyclic ring system, e.g., 9,10-anthraquinone, 1,4-naphthoquinone, 9,10-phenanthraquinone, 1,2-benzanthraquinone, etc., aromatic ketones, including vicinal ketaldonyl compounds such as diacetal, benzil etc., α-ketaldonyl alcohols, such as benzoin, pivaloin, etc., acyloin ethers, e.g. 2-methoxy-2-phenylacetophenone, 2-ethoxy-2-phenyl-acetophenone, etc. α-hydrocarbon substituted aromatic acyloins, including α-methyl benzoin, α-allylbenzoin and α-phenylbenzoin, polynuclear quinones such as 2-t-butylanthraquinone, and the like initiators. Such initiators are described in such patents as U.S. Pats. 2,367,660, 2,367,661, 2,367,670, 2,448,828, 2,722,512 and 3,046,127. Synergistic mixtures of initiators which are useful in the present invention include those described in U.S. Pat. 3,427,161 such as the mixture of benzophenone and Michler's ketone.

The compositions of the present invention can also incorporate thermal polymerization inhibitors to prevent premature polymerization of the composition during storage and handling. Suitable such inhibitors include p-methoxyphenol, hydroquinone, and alkyl and aryl-substituted hydroquinones and quinones, tert-butylcatechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloranil.

The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Coating compositions of this invention, can be prepared by dispersing or dissolving the constituents in any suitable solvent or combination of solvents used in the art to prepare coating dopes. Solvents that can be used to advantage are volatile organic solvents and include ketones such as 2-butanone, acetone, 4-methyl-2-pentanone, cyclohexanone, 2,4-pentanedione, 2,5-hexanedione, etc.; esters such as 4-butyrolactone, 2-ethoxyethyl acetate, 2-methoxyethyl acetate, n-butyl acetate, 2-methoxyethyl acetate, etc.; ethers such as 2-ethoxy ethanol; chlorinated hydrocarbon solvents such as chloroform, dichloroethane, trichloroethane, tetrachloroethane, etc.; and mixtures of these solvents.

Typically, the photopolymerizable compound and the film-forming binder can each be employed in the coating composition in the range from about 1 to 40 percent by weight. Preferably, they each comprise 5 to 25 percent by weight of the composition in a solvent such as listed above. The initiator can be incorporated in the coating composition in the range of about 0.1 to 25 percent by weight. The preferred range of initiator concentration is 0.1 to 10 percent by weight of the composition.

Photosensitive elements can be prepared by coating the photosensitive compositions from solvents onto supports in accordance with usual practices. Suitable support materials include fiber-base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyethylene, polypropylene, poly(alkyl methacrylate), e.g., poly(methyl methacrylate), polyester film base, e.g., poly(ethylene terephthalate), poly(vinyl acetals); polyamides, e.g., nylon, cellulose ester film base, e.g., cellulose nitrate, cellulose acetate, cellulose acetate propionic, cellulose acetate butyrate and the like. The optimum coating thickness for a particular purpose will depend on such factors as the use to which the coating will be put, the particular light-sensitive composition employed, and the nature of other compounds which may be present in the coating. Typical coating thicknesses can be from about 0.1 to 15 mil.

The coating composition can be coated directly on the support on which it is to be used in the preparation of a resist, a printing plate, or the like, or it can be coated on a temporary support and transferred, e.g., by thermal lamination, to the support where it is to be used, either uniformly or in an imagewise fashion. Such transfer techniques are described, for example, in U.S. Pats. 3,060,023, 3,346,383, 3,469,982 and in U.S. application Ser. Nos. 46,525 and 46,526, filed June 15, 1970.

Photomechanical images can be prepared with photosensitive elements of this invention by imagewise exposing the element to a source of actinic radiation for a period of time sufficient to polymerize and insolubilize material in exposed areas. Exposures of from several seconds to several minutes, or longer, e.g., ten seconds to fifteen minutes, are generally adequate. Suitable light sources that can be employed in exposing the elements include sources rich in visible radiation and sources rich in ultraviolet radiation, such as carbon arc lamps, xenon lamps, mercury vapor lamps, fluorescent lamps, tungsten, lamps, lasers and the like.

An image can then be developed by solvent washout of the unexposed non-insolubilized areas, using one of the solvents listed above as coating solvents, or others, by thermal transfer of the unexposed, non-hardened areas, or by other techniques known to those skilled in the art.

The following examples further illustrate the invention.

EXAMPLE 1

Preparation of 2,5-bis(4-methacryloyloxyethoxycarbonyloxy-3-methoxybenzylidene)cyclopentanone In a 1000 ml. flask is mixed 12.5 grams (0.03543 mole) of 2,5-divanillylidenecyclopentanone and 35.5 ml. of 2 N sodium hydroxide diluted to 200 ml. Complete solution is effected. The solution is cooled to 5° C. and 15 grams (0.078 mole) of 2-chloroformyloxyethyl methacrylate in 200 ml. of methylene chloride is added gradually via dropping funnel. The mixture is stirred for 4 hours after which the organic layer is separated. The organic layer is washed twice with water followed by two washings using a 2% solution of sodium hydroxide. The organic layer is dried over magnesium sulfate followed by evaporation of the methylene chloride. The title compound, a yellow solid is obtained. M.P. 83° C.

Calcd. (percent): C, 63.24; H, 5.46. Found (percent): C, 63.0; H, 5.6.

EXAMPLE 2

Preparation of 1,5-bis[4-(4-methacryloyloxyethoxycarbonyloxy)-3-methoxyphenyl]-1,4-pentadien-3-one The procedure described in Example 1 is repeated using the following compounds:

20 g. (0.0613 mole) of 1,3-divanillylideneacetone,
61.3 ml. of 2 N sodium hydroxide diluted to 200 ml.
26.0 g. (0.135 mole) of 2-chloroformyloxyethyl methacrylate diluted to 200 ml. with dichloroethane.

The title compound, a light orange viscous oil, is obtained.

Calcd. (percent): C, 61.87; H, 5.66; Found (percent): C, 58.6; H, 5.5.

EXAMPLE 3

Preparation of 1,5-bis(4-methacryloyloxyethoxycarbonyloxy-3-methoxyphenyl)pentan-3-one The procedure is identical to the one described in Example 1. The following chemical compounds are utilized:

15.75 g. (0.047 mole) of 1,5-bis(2-methoxy-4-hydroxyphenyl)pentan-3-one dissolved in 47 ml. of 2 N sodium hydroxide and 19.7 g. (0.102 mole) of 2-chloroformyloxyethyl methacrylate dissolved in 47 ml. of dichloroethane. The title product, a viscous oil, is obtained.

Calcd. (percent): C, 61.7; H, 5.9. Found (percent): C, 57.2; H, 5.7.

EXAMPLE 4

Preparation of 2,5-bis(4-methacryloyloxyethoxycarbonyloxy-3-methoxybenzyl)cyclopentanone The procedure of Example 1 is repeated using the following compounds:

10 g. (0.0281 mole) of 2,5-bis(4-hydroxy-3-methoxybenzyl)cyclopentanone dissolved in 31 ml. of 2 N sodium hydroxide diluted to 75 ml.; and 11.9 g. (0.0618 mole) of 2-chloroformyloxyethyl methacrylate diluted to 75 ml. with dichloroethane. The title compound, a viscous oil, is obtained.

EXAMPLE 5

1,5-bis[4-(2-hydroxy-3-methacryloyloxy-n-propoxy)-3-methoxyphenyl]-1,4-pentadien-3-one A 100 ml. flask is charged with 5.16 g. (0.0158 mole) of divanillylideneacetone, 8.98 g. (0.0632 mole) of glycidyl methacrylate, 0.292 g. (0.00265 mole) of tetramethylammonium chloride and 0.03 g. of p-methoxyphenol. The resultant mixture is stirred well then heated to 65° C. for four hours. The yellow viscous oil obtained is dissolved in 50 ml. of dichloroethane; the organic solution is washed three times with a two percent sodium hydroxide solution. The organic layer is separated and washed twice with distilled water. The dichloroethane solution is dried over mangesium sulfate followed by evaporation of the dichloroethane under vacuum. The title compound, a clear viscous oil, is obtained.

Calcd. (percent): C, 64.9; H, 6.27. Found (percent): C, 62.7; H, 6.1.

EXAMPLE 6

1,5-bis[4-(2,3-dimethacryloyloxy-n-propoxy)-3-methoxyphenyl]-1,4-pentadien-3-one A 500 ml. flask is charged with 96.5 g. (0.158 mole) of 1,5 - bis[4-(2-hydroxy-3-methacryloyloxy-n-propoxy)-3-methoxyphenyl]-1,4-pentadien-3-one prepared as in Example 5 and 100 ml. of pyridine. Sixteen grams (0.158 mole) of methacryloyl chloride diluted to 100 ml. with dichloroethane is added to the stirred solution. The solution is heated to 70° C. and maintained at that temperature for three hours. Upon cooling the reaction solution is extracted twice with two percent base, twice with 2% acid and a third time with 2% base. The organic solution is dried followed by evaporation of the dichloroethane. The structure of the compound is confirmed by nuclear magnetic reasonance spectra.

EXAMPLE 7

Preparation of 1,3-bis[4-(4-methacryloyloxybenzoyloxy)-3-vanillylidene]acetone (A) Preparation of 4-carboxyphenyl methacrylate.—A 1-liter round-bottom flask is charged with 145 ml. of 2 N sodium hydroxide solution diluted to 200 ml. and 190 ml. of chloroform. The mixture is cooled to 2° C., 20 g. (0.145 mole) of 4-hydroxybenzoic acid is added, and with cooling and stirring, 15.15 g. (0.145 mole) of methacryloyl chloride is added rapidly from a dropping funnel. After the temperature equilibrates, the cooling bath is removed and stirring continued for 3 hours longer. The aqueous phase is separated and acidified to produce a white solid. The solid is collected, extracted with diethyl ether, the extracts filtered, dried over magnesium sulfate, and the solvent removed by evaporation. A white solid melting at 183–185° C. is obtained.

Calcd. (percent): C, 64.1; H, 4.9. Found (percent): C, 64.3; H, 4.9.

(B) Preparation of 4-methacryloyloxybenzoic acid chloride.—Five grams (0.0242 mole) of the 4-carboxyphenyl methacrylate prepared in Part A is dissolved in 100 ml. of benzene and treated with 8.64 g. (0.0726 mole—5.27 ml.) of thionyl chloride with stirring. The stirred mixture is carefully heated for reflux (about 80° C.) and maintained at that temperature for 2.5 hours. The mixture is cooled, the solvent removed by evaporation and the solid is redissolved in benzene twice, and the solvent evaporated. The white solid melted at 71–72° C.

(C) Preparation of the title monomer.—Divanillalacetons (3.945 g., 0.0121 mole) in 12.1 ml. of 2 N sodium hydroxide solution diluted to 100 ml. is mixed with 50 ml. of 1,2-dichloroethane, cooled to 0° C., and treated with 5.43 g. (0.242 mole) of the acid chloride prepared in Part B dissolved in 50 ml. of 1,2-dichloroethane. The mixture is agitated about 18 hours, the organic layer separated, the aqueous layer extracted twice with 1,2-dichloroethane, the extracts combined with the organic phase, washed three times with 2 N sodium hydroxide solution, dried over magnesium sulfate, and the solvent removed by evaporation to provide an orange residue. The residue is washed with sodium hydroxide solution, redissolved in 1,2-dichloroethane, extracted twice with 2 N sodium hydroxide solution, and the solvent removed by evaporation to provide 3.8 g. of a yellow solid melting at 205–207° C. (sintering at 200° C.).

Calcd. (percent): C, 70.3; H, 4.9. Found (percent): C, 69.8; H, 5.3.

EXAMPLE 8

Preparation of 1,3-bis[4-(4-methacrylamidobenzolyloxy)-3-vanillylidene]acetone (A) Preparation of 4-methacrylamidobenzoic acid.—To a mixture of 20 g. (0.146 mole) of 4-aminobenzoic acid, 146 ml. of 2 N sodium hydroxide diluted to 200 ml., and 200 ml. of chloroform cooled to 5 to 10° C. is added with vigorous stirring 16.7 g. (0.16 mole) of methacryloyl chloride at a moderate rate from a dropping funnel. After 15 minutes, the cooling bath is removed, the mixture stirred about 30 minutes, and allowed to stand about 16 hours. The solid is collected and dried to yield 26.1 g. melting at 222–224° C. (sintering at 218° C.).

Calcd. (percent): C, 64.4; H, 5.4; N, 6.8. Found (percent): C, 63.7; H, 5.2; N, 6.7.

(B) Preparation of 4-methacrylamidobenzoic acid chloride.—The compound is prepared by the procedure of Part B of Example 7 using 3 g. (0.01462 mole) of the 4-methacrylamidobenzoic acid prepared in Part A in 80 ml. of benzene and 3.2 ml. (5.22 g.) of thionyl chloride. The product melts at 131–134° C.

Calcd. (percent): C, 59.1; H, 4.5; Cl, 15.8; N, 6.3. Found (percent): C, 59.0; H, 4.7; Cl, 15.6; N, 6.2.

(C) Preparation of the title monomer.—To a stirred suspension of 5.0 g. (0.0224 mole) of the acid chloride prepared in Part B, 125 ml. of dry chloroform, and 30 ml. of pyridine is added 3.66 g. (0.0112 mole of divanillalacetone. The mixture is stirred 16 hours at ambient temperature, the solid collected by filtration, the liquors concentrated to provide another crop, and the combined crops crystallized from trichloroethylene.

Calcd. (percent): C, 70.3; H, 5.2; N, 4.0. Found (percent): C, 70.0; H, 5.3; N, 4.1.

EXAMPLE 9

Preparation of 1,3-bis{4-[4-(2-methacryloyloxyethoxyformamido)benzoyloxy]-3-vanillylidene}acetone (A) Preparation of 4-(2-methacryloyloxyethoxyformamido)-benzoic acid.—A mixture of 8.00 g. (0.0583 mole) of 4-aminobenzoic acid and 58.3 ml. of 2 N sodium hydroxide diluted to 100 ml. is cooled to −10 to +5° C. and slowly treated with 11.21 g. (0.0583 mole) of 2-chloroformyloxyethyl methacrylate in 100 ml. of chloroform. Stirring at −10° C. is continued for 30 minutes after the addition is completed, the cooling bath is removed, and stirring continued for about 2 hours longer as the temperature rises to room temperature. The aqueous phase is separated, filtered, acidified, and the yellow solid collected and dried to provide 6.0 g. melting at 162–165° C.

Calcd. (percent): C, 57.3; H, 5.2; N, 4.8. Found (percent): C, 57.0; H, 5.6; N, 4.8.

(B) Preparation of 4-(2-methacryloyloxyethoxyformamido)benzoic acid chloride.—This compound is prepared as described in Part B of Example 7 using 1 g. (0.00341 mole) of the acid prepared in Part A above, 10 ml. of benzene as the solvent and 0.744 ml. (1.218 g., 0.012 mole) of thionyl chloride. The product melts at 126–128° C.

Calcd. (percent): C, 53.9; H, 4.5; Cl, 11.4; N, 4.5. Found (percent): C, 54.1; H, 4.5; Cl, 10.2; N, 4.4.

(C) Preparation of the monomer.—A suspension of 0.55 g. (0.00177 mole) of the acid chloride prepared in Part B above, 10 ml. of methylene chloride, and about 1 ml. of pyridine is treated with a solution of 0.2905 g. (0.00089 mole) of divanillalacetone in 15 ml. of pyridine and the mixture stirred for 1 hour, refluxed for 2 hours, cooled, the white solid removed by filtration, the organic solution washed three times with water, dried over magnesium sulfate, and concentrated to an orange-yellow solid. After trituration in benzene and drying, the solid melts at 191–193° C.

Calcd. (percent): C, 64.4; H, 5.1; N, 3.2. Found (percent): C, 63.7; H, 5.0; N, 3.1.

EXAMPLE 10

Preparation of a polysulfonate copolymer

In a 500 ml. round bottom flask equipped with a stirrer, condenser, and addition funnel are placed 13.20 g. (0.04 mole) of 1,5-bis(4-hydroxy-3-methoxyphenyl) pentan-3-one, and 84 ml. (0.084 mole) of normal sodium hydroxide. The solution is stirred for 10 minutes and 0.24 g. of benzyltriethylammonium chloride is added. The solution is stirred an additional five minutes. To this stirred solution is added rapidly (1 minute) 5.50 g. (0.02 mole) of 1,3-benzenedisulfonyl chloride and 6.06 g. (0.02 mole) 1,3-dimethyl-4,6-benzenedisulfonyl chloride dissolved in 84 ml. of methylene chloride. After the addition is completed, the solution is stirred for 2 hours. The resultant polymer is isolated by dripping the reaction mixture into hot water with stirring. The polymer is placed in a blender with methanol and chopped up into small particles, then leached with a methanol-water mixture for 3 hours, then filtered and dried in a vacuum oven at 50 C. for 20 hours. The white polymer copoly[cyclopentanon-2,5 - ylenedimethylenebis(3-methoxy - p - phenylene) 1,3-benzenedisulfonate-co-1,3-dimethyl - 4,6 - benzenedisulfonate] is isolated in better than 90 percent yield. Inherent viscosity in 1:1 by volume mixture of phenol-chlorobenzene (0.25 g./100 cc. solution at 25° C.) is 1.7. Unless otherwise specified, inherent viscosities reported in subsequent examples are measured using the same solvents and conditions as this example.

EXAMPLE 11

Preparation of a poly(sulfonate-carboxylate)

In a 300 ml. round bottom flask equipped with a stirrer, condenser, thermometer and dropping funnel are placed 14.2 g. (0.04 mole) of 2,5-bis(4-hydroxy-3-methoxybenzyl)cyclopentanone and 100 ml. of methylene chloride. The contents of the flask are heated until solution is completed and then cooled to 25° C. To this stirred solution is added 5.78 g. (0.02 mole) of 1 methyl-2,4-benzene disulfonyl chloride and 4.06 g. (0.02 mole) of terephthaloyl chloride dissolved in 40 ml. of methylene chloride. To the above solution is aded dropwise over a 5 minute period 8.90 g. (0.088 mole) of triethylamine. The temperature rises to 40 C. and heat is applied to maintain reflux for 45 minutes. The resultant polymer is isolated by dripping the reaction mixture into hot water. The solution is filtered and the polymer placed in a blender with methanol and chopped into small particles, then leached with a methanol-water mixture for 3 hours and dried in a vacuum oven at 50° C. for 20 hours. The white polymer copoly[cyclopentanon - 2,5 - ylenedimethylenebis(3 - methoxy-p-phenylene) 1-methyl-2,4-benzenedisulfonate - co-terephthalate] is isolated in better than 90% yield. Inherent viscosity is 0.82.

*Analysis.*—Calcd. for $C_{57}H_{55}O_{16}S_2$ (percent): C, 64.6; H, 5.2; S, 6.1. Found (percent): C, 64.2; H, 5.6; S, 5.8.

EXAMPLE 12

Preparation of a polysulfonate-carboxylate copolymer

In a 300 ml. round bottom flask equipped with a stirrer, condenser, thermometer and dropping funnel is mixed 13.30 g. (0.04 mole) of 1,5-bis(4-hydroxy-3-methoxyphenyl)pentan-3-ol (HHDVA) and 40 ml. of methylene chloride. To the well-stirred mixture is added a methylene chloride solution of 5.78 g. (0.02 mole) of 2,4-toluenedisulfonyl chloride (m-TDSC), 2.03 g. (0.01 mole) isophthaloyl chloride (IPC), and 2.03 g. (0.01 mole) of terephthaloyl chloride (TPC). The temperature of the reaction solution rises from 23° C. to 35° C. as 8.90 g. (0.088 mole) of triethylamine is added dropwise to the mixture. Solution is effected. An additional 20 ml. of methylene chloride is used to rinse the reagent addition equipment. The reaction is run a total of 35 minutes. The reaction solution is poured into hot water and the precipitated polymer, copoly[3-hydroxy-1,5-pentylenebis(3-methoxy-p-phenylene) 1,3-dimethyl - 2,4 - benzenedisulfonate-co-isophthalate-co-terephthalate], is dried under vacuum at 50 C. for 24 hours. Yield is 20.0 g. Inherent viscosity is 0.64.

*Analysis.*—Calcd. (percent): C, 62.69; H, 5.48; S, 6.34. Found (percent): C, 62.6; H, 5.8; S, 6.3.

Using the same reactants, polymers are prepared having inherent viscosities ranging from 0.34 to 1.11.

EXAMPLE 13

Preparation of a polysulfonate-carboxylate copolymer

In a 3-liter round bottom flask is placed 127.8 g. (0.768 mole) of HHDVA and 58.0 g. (0.2 mole) of m-TDSC. To the mixture is added 1000 ml. of methylene chloride and vigorous stirring of the mixture is continued for 5 minutes. To the stirred mixture is added 97.2 g. (0.96 mole) of triethylamine via dropping funnel over a period of 30 minutes. To the solution is added 3.01 g. (0.032 mole) of phenol. Isophthaloyl chloride, 20.3 g. (0.1 mole) and terephthaloyl chloride 20.3 g. (0.1 mole) are dissolved in 300 ml. of methylene chloride and slowly added to the reaction flask at such a rate as to maintain a reaction temperature of 30° C. All the reagent additions are followed by a methylene chloride wash to insure complete transfer. The reaction is allowed to stir for 1½ hours after all the additions are complete. The solution is quenched with 300 ml. of a 2% hydrochloric acid solution. The organic layer is washed with water until the washings are neutral. The polymer, copoly[3-hydroxy-1,5-pentylenebis(3-methoxy - p - phenylene) 1,3-dimethyl-2,4 - benzenedisulfonate - co - isophthalate-co-terephthalate], is precipitated in methanol. Yield is 192.7 g. Inherent viscosity is 0.37.

*Analysis.*—Calcd. (percent): C, 62.9; H, 5.5; S, 6.3. Found (percent): C, 62.5; H, 5.3; S, 6.9.

EXAMPLE 14

Preparation of a polysulfonate-carboxylate copolymer

In a 300 ml. flask is mixed 6.65 g. (0.02 mole) of HHDVA and 6.70 g. (0.02 mole) of 1,5-bis(4-hydroxy-3-methoxyphenyl)pentan-3-one (HDVA). A 60 ml. methylene chloride solution containing 5.80 g. (0.02 mole) of 2,4-toluenedisulfonyl chloride, 2.03 g. (0.01 mole) of isophthaloyl chloride and 2.03 g. (0.01 mole) of terephthaloyl chloride is added to the mixture of phenols. Triethylamine, 8.90 g. (0.088 mole), is added dropwise over a 10-minute period with vigorous stirring. The reaction solution is stirred for 15 minutes before precipitating the polymer, copoly[3-hydroxy - 1,5-pentylenebis(3-methoxy-p-phenylene)-co - 3 - pentanon-1,5-ylenebis(3-methoxy-p-phenylene) 1,3-dimethyl - 2,4 - benzenedisulfonate-co-isophthalate-co-terephthalate, in hot water. Yield is 21.0 g. Inherent viscosity is 0.78.

*Analysis.*—Calcd. (percent): C, 63.0; H, 5.3; S, 6.4. Found (percent): C, 62.4; H, 5.4; S, 6.3.

EXAMPLE 15

Reaction of the alcoholic hydroxyl group in the backbone of the polysulfonate-carboxylate copolymer with hexanoyl chloride A one liter flask is charged with 50 g. (0.0247 mole) of a polysulfonate-carboxylate copolymer prepared with the same ingredients and essentially as described in Example 13 ($N_{inh}$=0.37) and 300 ml. of pyridine. To the resultant solution is added 14.6 g. (0.1087 mole) of hexanoyl chloride and 300 ml. of methylene chloride. The reaction solution is stirred at 60° C. for 5 hours and cooled overnight. The pyridine hydrochloride is filtered off and the polymer is precipitated in aqueous methanol. The polymer, copoly[3-hydroxy-1,5-pentylenebis(3-methoxy - p - phenylene)-co-3-hexanoyloxy-1,5-pentylenebis-(3-methoxy - p - phenylene) 1,3-dimethyl-2,4-benzenedisulfonate-co-isophthalate-co-terephthalate] is collected, dissolved in methylene chloride, and reprecipitated in methanol. Yield is 54 g. Inherent viscosity is 0.37.

*Analysis.*—Calcd. (percent): C, 64.56; H, 6.33; S, 5.30. Found (percent): C, 64.0; H, 6.2; S, 6.1.

EXAMPLES 16–35

Using the procedure of Examples 10 and 11, polysulfonates and polysulfonate-carboxylates are prepared using the monomers described below.

*Code*

α0=

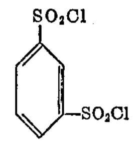

α1=

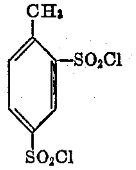

α2=

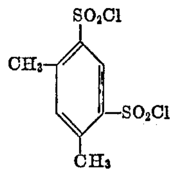

HDVA=1,5bis(4-hydroxy-3-methoxyphenyl) pentan-3-one
HDVCP=2,5-bis(4-hydroxy-3-methoxybenzyl) cyclopentanone
BPA=Bisphenol A
TPC=Terephthaloyl chloride
IPC=Isophthaloyl chloride Polysulfonate homopolymers having the structure:

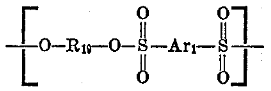

| | Monomers employed to derive | | |
|---|---|---|---|
| | $R_{19}$ | Ar | $\eta_{inh.}$ |
| Example: | | | |
| 16 | HDVA | α0 | 1.5 |
| 17 | HDVA | α1 | 1.2 |
| 18 | HDVA | α2 | 0.8 |
| 19 | HDVCP | α1 | 0.63 |

Polysulfonate copolymers having the structure:

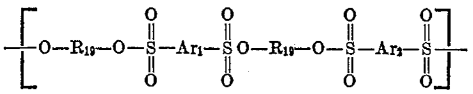

| | Monomers employed to derive | | | |
|---|---|---|---|---|
| | $R_{19}$ | $Ar_1$ | $Ar_2$ | $\eta_{inh.}$ |
| Example: | | | | |
| 20 | HDVA | α0 | α1 | 0.8 |
| 21 | HDVA | α0 | α2 | 1.7 |
| 22 | HDVA | α1 | α2 | 1.2 |
| 23 | HDVCP | α0 | α1 | 1.2 |

Polysulfonate copolymers having the structure:

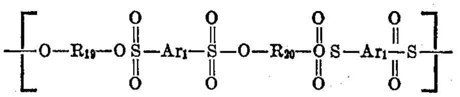

| | Monomers employed to derive | | | |
|---|---|---|---|---|
| | $R_{19}$ | $Ar_1$ | $R_{20}$ | $\eta_{inh.}$ |
| Example: | | | | |
| 24 | BPA | α0 | HDVA | 1.3 |
| 25 | BPA | α1 | HDVA | 1.4 |
| 26 | BPA | α2 | HDVA | 0.6 |
| 27 | BPA | α1 | HDVCP | 0.40 |

Poly(sulfonate-carboxylates) having the structure:

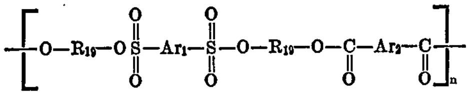

| | Monomers employed to derive | | | |
|---|---|---|---|---|
| | $R_{19}$ | $Ar_1$ | $Ar_2$ | $\eta_{inh.}$ |
| Example: | | | | |
| 28 | HDVA | α0 | TPC | 1.4 |
| 29 | HDVA | α1 | TPC | 1.8 |
| 30 | HDVA | α2 | TPC | 1.3 |
| 31 | HDVCP | α1 | TPC | 0.82 |

Poly(sulfonate-carboxylates) having the structure:

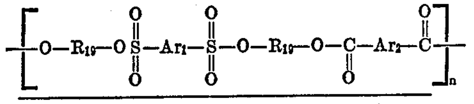

| | Monomers employed to derive | | | |
|---|---|---|---|---|
| | $R_{19}$ | $Ar_1$ | $Ar_2$ | $\eta_{inh.}$ |
| Example: | | | | |
| 32 | HDVA | α0 | TPC/IPC | 0.61 |
| 33 | HDVA | α1 | TPC/IPC | 0.78 |
| 34 | HDVA | α2 | TPC/IPC | 0.44 |
| 35 | HDVCP | α9 | TPC/IPC | 0.58 |

EXAMPLES 36–39

Using the procedure of Example 15 and polymers prepared in accordance with Examples 12–14, the alcoholic hydroxyl group on the polymer is reacted with various carboxylic acid chlorides to yield polymers having the structure:

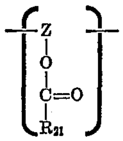

| | $R_{21}$ | $\eta_{inh.}$ |
|---|---|---|
| Example: | | |
| 36 | $CH_3(CH_2)_4-$ | 0.81 |
| 37 | $CH_3(CH_2)_6-$ | 1.16 |
| 38 | $CH_3(CH_2)_3CH(C_2H_5)-$ | 0.77 |
| 39 | $CH_3(CH_2)_{16}-$ | 0.43 |

EXAMPLES 40–48

Preparation of photopolymerizable compositions and elements

One gram of poly(sulfonate-carboxylate) (made according to the procedure of Example 10) is dissolved in 5 ml. of 1,2-dichloroethane. One gram of photopolymerizable monomer (made as in Examples 1–6) is added to the binder solution followed by 0.01 gram of the arylidiazosulfone initiator, 4-dimethylaminophenyl(p-tolylsulfonyl)diimide, and 0.01 gram of the sensitizer 4-(4-n-amyloxyphenyl) - 2,6 - bis(4-ethoxyphenyl)thiapyrylium perchlorate. The viscous solution is coated on aluminum, copper or polymeric film support at a wet thickness of 0.012 inch and air-dried. The layer is flushed with nitrogen and covered with a sheet of poly(ethylene terephthalate) film. The dry layer is exposed imagewise to actinic radiation using a pulsed xenon source. The exposed plate is developed as follows:

(1) Spray developed in an appropriate solvent for 30–60 seconds;

(2) Swabbed developed with the same solvent using a multilith pad and making from two to ten passes;

(3) Tray developed in the same solvent for an additional 15–30 seconds with swabbing followed by a water rinse.

Compositions as described above, using the following monomers and polymers are prepared, and coated, exposed and developed as described above using the following developer solvent.

| | Monomer of Example | Polymeric binder of Example | Developer solvent |
|---|---|---|---|
| Example: | | | |
| 40 | 1 | 33 | 50 parts 1,2,2-trichloroethylene; 15 parts 1,1,2-trichloroethane. |
| 41 | 2 | 33 | 1,1,2-trichloroethylene. |
| 42 | 3 | 33 | Do. |
| 43 | 5 | 33 | Do. |
| 44 | 6 | 33 | 75 parts 1,1,2-trichloroethylene; 25 parts 1,1,2-trichloroethane. |
| 45 | 1 | 32 | 1,1,2-trichloroethylene. |
| 46 | 2 | 32 | Do. |
| 47 | 3 | 32 | Do. |
| 48 | 5 | 32 | Do. |

In all cases good robust images are obtained. The images are hard, non-tacky and give good resolution. The images on aluminum and copper show excellent adhesive properties. The images on these substrates are treated with 50% sodium hydroxide etchant solution and show very good resistance to this treatment.

EXAMPLE 49

One gram of polymeric binder of Example 13 modified as in Example 37 is dissolved in 5.0 ml. of methylene chloride. To the solution is added 1.0 gram of the monomer of Example 3, 0.1 gram of 2-tert-butylanthraquinone and from 0% to 10% by weight of a plasticizer such as ethylenebis(2-oxyethyl acetate). The resulting formulation is knife-coated on 3 mil poly(ethylene terephthalate) film support at 12 mil wet thickness and a temperature of 43° C. The coating is dried on the heated coating block for five minutes, then baked five minutes at 90° C. and allowed to cool before being laminated at ambient temperature to a freshly pumiced copper surface. The 3 mil poly(ethylene terephthalate) film support is replaced with a 1 mil polypropylene film. The dry layer is exposed imagewise to actinic radiation using a pulsed xenon source. The exposed plate is then baked at 90° C. for five minutes and spray-developed with 1,1,1-trichloroethane. A robust, glossy image is obtained. The image is hard, non-tacky, produces good resolution and shows good adhesion to the copper substrate.

The polymeric binders of Examples 12 and 14 modified as in Examples 36 to 39 are similarly used in photopolymerizable compositions and produce similar results.

EXAMPLE 50

One gram of the polymeric binder of Example 12 modified as in Example 36 is dissolved in 5.0 ml. of 1,2-dichloroethane. To the solution is added 1.0 gram of the monomer of Example 2; 0.01 gram of 4-(4-n-amyloxyphenyl)-2,6-bis(4-ethoxyphenyl)thiapyrylium perchlorate and 0.01 gram of 4-dimethylaminophenyl(p-tolylsulfonyl)diimide. The resultant formulation is knife-coated on aluminum at a 12 mil wet coating thickness, dried on the heated coating block for five minutes and after cooling, a 2.5 mil sheet of poly(ethylene terephthalate) film is applied to the dried coating. The coatnig is exposed to actinic radiation using a pulsed xenon source. The exposed plate is then spray-developed with 1,1,1-trichloroethane. A robust, glossy image of approximately 2.5 mil thickness is obtained. The image is hard, non-tacky, produces good resolution and exhibits excellent adhesion to the aluminum substrate.

Similar results are obtained when the monomers of Examples 5 and 6 are used in the above formulation.

The invention has been described in detail with particular reference to preferred embodiments thereof, but it will be understood that certain variations and modifications can be effected within the spirit and scope of the invention.

What is claimed is:

1. A photopolymerizable composition comprising:
(a) an ethylenically unsaturated monomer which is a bisacrylate or bismethacrylate of a bisphenol wherein the phenol groups are joined by an aliphatic ketone group,
(b) a film-forming aromatic polysulfonate or polysulfonate-carboxylate binder and
(c) a photoactivatable polymerization initiator.

2. A composition of claim 1 wherein the monomer has the formula

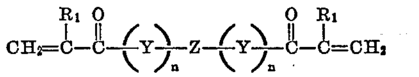

where:

$R_1$ is hydrogen or methyl;

Z is

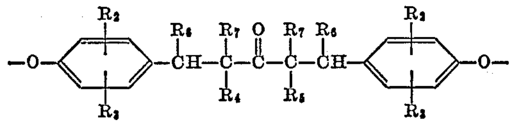

where:

$R_2$ and $R_3$ are independently hydrogen or methoxy, $R_4$ and $R_5$ are hydrogen or together represent the hydrocarbon group necessary to complete a ring of 5 to 6 carbon atoms, $R_6$ and $R_7$ are hydrogen or together represent a covalent bond, $n$ is 0 or 1;

Y is a linking group selected from those represented by the structural formulae:

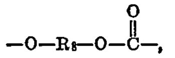

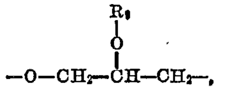

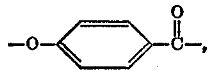

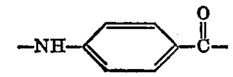

and

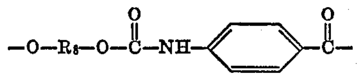

where:

$R_8$ is alkylene of 1 to 4 carbon atoms, and $R_9$ is hydrogen, alkanoyl of 1 to 4 carbon atoms, acryloyl or methacryloyl.

3. A composition of claim 2 wherein
$R_2$ is methoxy,
$R_3$ is hydrogen,
$n$ is 1, and Y is 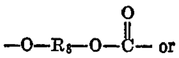 or 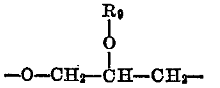

4. A composition of claim 3 wherein

Y is 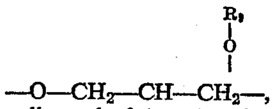, and $R_9$ is alkanoyl of 1 to 4 carbon atoms.

5. A composition of claim 1 wherein the film-forming binder is the condensation product of at least one bisphenol, in at least one of which the phenol groups are joined by an aliphatic ketone group or an aliphatic secondary alcohol group, with at least one aromatic disulfonic acid chloride or with a mixture of at least one aromatic dicarboxylic acid chloride or aromatic bischloroformate.

6. A composition of claim 5 wherein the phenol groups of at least one of the bisphenols are joined by an aliphatic secondary alcohol group.

7. A composition of claim 6 wherein the film-forming binder is the condensation product of claim 6 further modified by reaction with an alkyl acid chloride to convert aliphatic secondary alcohol groups to aliphatic ester groups.

8. A composition of claim 2 wherein the film-forming binder has repeating units derived from at least one bisphenol, at least one of which provides repeating units having the structure.

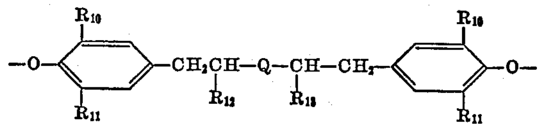

where $R_{10}$ and $R_{11}$ are each hydrogen, lower alkyl of 1 to 4 carbon atoms or lower alkoxy of 1 to 4 carbon atoms; $R_{12}$ and $R_{13}$ are each hydrogen or together represent the hydrocarbon group necessary to complete a saturated ring of 5 to 6 carbon atoms; Q is a

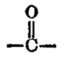

group or a

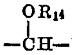

group; and $R_{14}$ is hydrogen or an alkanoyl group of 2 to 20 carbon atoms; alternating with repeating units derived from at least one aromatic diacid chloride, at least one of which provides repeating units having the structure

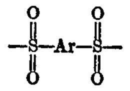

wherein Ar represents an arylene group.

9. A composition of claim 8 wherein the binder further comprises repeating units derived from a second bisphenol, which units have the structure.

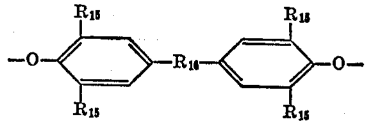

wherein $R_{15}$ is independently hydrogen, halogen or lower alkyl of 1 to 4 carbon atoms and $R_{16}$ is an alkylene group of 1 to 8 carbon atoms, and alternating units derived from an aromatic diacid chloride, which units have the structure

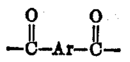

wherein Ar is an arylene group.

10. A composition of claim 8 wherein the binder further comprises repeating units derived from a second bisphenol, which units have the structure

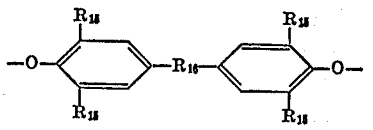

wherein $R_{15}$ is independently hydrogen, halogen or lower alkyl of 1 to 4 carbon atoms and $R_{16}$ is an alkylene group of 1 to 8 carbon atoms, and alternating units derived from an aromatic diacid chloride, which units have the structure

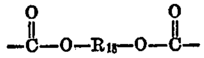

where $R_{18}$ is an alkylene group of 1 to 20 carbon atoms.

11. A composition of claim 2 wherein the film-forming binder has repeating units derived from at least one bisphenol, at least one of which provides repeating units having the structure

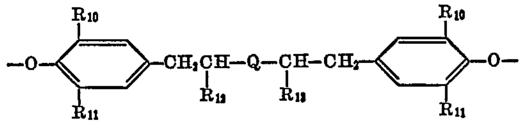

where $R_{10}$ and $R_{11}$ are each hydrogen, lower alkyl of 1 to 4 carbon atoms or lower alkoxy of 1 to 4 carbon atoms; $R_{12}$ and $R_{13}$ are each hydrogen or together represent the hydrocarbon group necessary to complete a saturated ring of 5 to 6 carbon atoms; Q is a

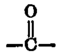

group or a

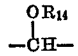

group; and $R_{14}$ is hydrogen or an alkanoyl group of 2 to 20 carbon atoms; alternating with repeated units derived from at least one aromatic diacid chloride, at least one of which provides repeating units having the structure

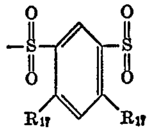

wherein $R_{17}$ is independently a hydrogen atom or a lower alkyl group of 1 to 4 carbon atoms.

12. A composition of claim 11 wherein the binder further comprises repeating units derived from a second bisphenol, which units have the structure

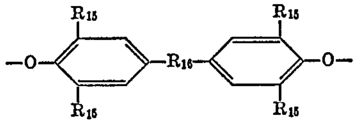

wherein $R_{15}$ is independently hydrogen, halogen or lower alkyl of 1 to 4 carbon atoms and $R_{16}$ is an alkylene group of 1 to 8 carbon atoms, and alternating units derived from an aromatic diacid chloride, which units have the structure

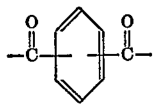

13. A composition of claim 11 wherein the binder further comprises repeating units derived from a second bisphenol, which units have the structure

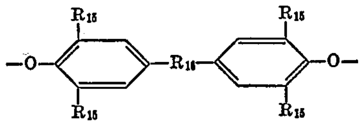

wherein $R_{15}$ is independently hydrogen, halogen or lower alkyl of 1 to 4 carbon atoms and $R_{16}$ is an alkylene group of 1 to 8 carbon atoms, and alternating units derived from an aromatic diacid chloride, which units have the structure

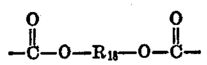

where $R_{18}$ is an alkylene group of 1 to 20 carbon atoms.

14. A photopolymerizable composition comprising:

(a) an ethylenically unsaturated sulfonate-carboxylate monomer having the structure

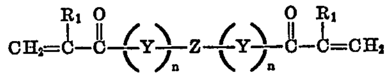

where:

$R_1$ is hydrogen or methyl;

Z is

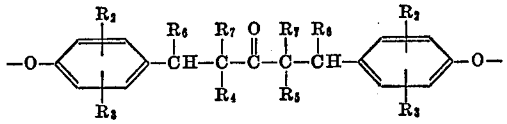

where:

$R_2$ is methoxy, $R_3$ is hydrogen, $R_4$ and $R_5$ are hydrogen or together represent the hydrocarbon group necessary to complete a ring of 5 to 6 carbon atoms.

$R_6$ and $R_7$ are hydrogen or together represent a covalent bond,

*n* is 1,

Y is a linking group selected from those represented by the structural formula

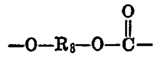

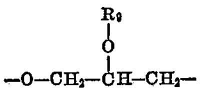

and where:

$R_8$ is alkylene of 1 to 4 carbon atoms and $R_9$ is hydrogen, alkanoyl of 1 to 4 carbon atoms, acryloyl or methacryloyl;

(b) a film-forming binder having repeating units having the structure

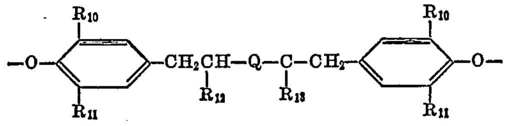

where $R_{10}$ and $R_{11}$ are each hydrogen, lower alkyl of 1 to 4 carbon atoms or lower alkoxy of 1 to 4 carbon atoms; $R_{12}$ and $R_{13}$ are each hydrogen or together represent the hydrocarbon group necessary to complete a saturated ring of 5 to 6 carbon atoms; Q is a

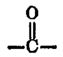

group or a

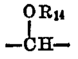

group; and $R_{14}$ is hydrogen or an alkanoyl group of 2 to 20 carbon atoms; alternating with repeating units derived from at least one aromatic diacid chloride, at least one of which provides repeating units having the structure

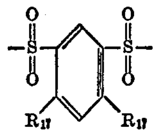

wherein $R_{17}$ is independently a hydrogen atom or a lower alkyl group of 1 to 4 carbon atoms; and (c) a photoactivatable polymerization initiator.

15. A photosensitive element comprising a support bearing a layer of the composition of claim 1.

16. A photosensitive element comprising a support bearing a layer of the composition of claim 3.

17. A photosensitive element comprising a support bearing a layer of the composition of claim 7.

18. A photosensitive element comprising a support bearing a layer of the composition of claim 8.

19. A photosensitive element comprisng a support bearing a layer of the composition of claim 11.

20. A photosensitive element comprising a support bearing a layer of the composition of claim 14.

21. A process for preparing a photomechanical image which comprises exposing to an imagewise pattern of actinic radiation an element of claim 15 to harden exposed areas of the composition and developing an image by removing unexposed composition from the element.

References Cited

UNITED STATES PATENTS

| | | | |
|---|---|---|---|
| 3,632,493 | 1/1972 | Rogers | 260—47 UA |
| 3,624,131 | 11/1971 | Becker | 260—479 R |
| 3,661,576 | 5/1972 | Crary | 96—115 P |
| 3,017,383 | 1/1962 | Lappin | 260—479 R |
| 2,938,883 | 5/1960 | Raich | 260—479 |

NORMAN G. TORCHIN, Primary Examiner

J. L. GOODROW, Assistant Examiner

U.S. Cl. X.R.

96—115 P; 260—479 R

UNITED STATES PATENT AND TRADEMARK OFFICE

CERTIFICATE OF CORRECTION

PATENT NO. : 3,748,133

DATED : July 24, 1973

INVENTOR(S) : John M. Noonan, et al

It is certified that error appears in the above-identified patent and that said Letters Patent are hereby corrected as shown below:

Column 19, lines 67-71, that part of formula reading:

```
        R9                                  R9
        '                                   '
        O                                   O
        '                                   '
     CH-CH2      should read             CH-CH2   .
```

Column 20, line 4, before "dicarboxylic", --disulfonic acid chloride and at least one aromatic-- should be inserted; line 17, after "structure", "." should be deleted; line 47, after "structure", "." should be deleted. Column 22, line 35, after that part of the formula reading:

```
        O
        "
        C-                   --, and--
```

should be inserted; and on line 40, "and" should be deleted.

Signed and Sealed this

Thirty-first Day of August 1976

[SEAL]

*Attest:*

RUTH C. MASON
*Attesting Officer*

C. MARSHALL DANN
*Commissioner of Patents and Trademarks*